United States Patent
Huang (10) Patent No.: US 8,476,918 B2
(45) Date of Patent: Jul. 2, 2013

(54) APPARATUS AND METHOD FOR WAFER LEVEL CLASSIFICATION OF LIGHT EMITTING DEVICE

(75) Inventor: Hsin-Chieh Huang, Hsin-Chu (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 563 days.

(21) Appl. No.: 12/769,231

(22) Filed: Apr. 28, 2010

(65) Prior Publication Data

US 2011/0267087 A1 Nov. 3, 2011

(51) Int. Cl.
*G01R 31/20* (2006.01)

(52) U.S. Cl.
USPC ............ 324/754.01; 324/757.03; 324/754.04; 324/759.03; 324/762.05; 324/762.02; 324/755.01; 324/762.01

(58) Field of Classification Search
USPC ............ 324/754.01, 757.03, 757.04, 759.03, 324/755.01, 760, 762.01, 762.02, 762.05
See application file for complete search history.

(56) References Cited

U.S. PATENT DOCUMENTS

| | | | | |
|---|---|---|---|---|
| 4,684,883 A | * | 8/1987 | Ackerman et al. | 324/71.5 |
| 4,775,640 A | * | 10/1988 | Chan | 438/16 |
| 4,862,075 A | * | 8/1989 | Choi et al. | 324/754.27 |
| 4,899,106 A | * | 2/1990 | Ogura | 324/754.18 |
| 4,933,635 A | * | 6/1990 | Deutsch et al. | 324/756.02 |
| 4,950,982 A | * | 8/1990 | Obikane et al. | 324/750.16 |
| 5,225,037 A | * | 7/1993 | Elder et al. | 216/18 |
| 5,266,059 A | * | 11/1993 | Taylor | 439/70 |
| 5,381,103 A | * | 1/1995 | Edmond et al. | 324/754.06 |
| 5,471,148 A | * | 11/1995 | Sinsheimer et al. | 324/750.25 |
| 5,477,138 A | * | 12/1995 | Erjavic et al. | 324/762.02 |
| 5,541,416 A | * | 7/1996 | Washizuka | 250/458.1 |
| 5,631,571 A | * | 5/1997 | Spaziani et al. | 324/754.03 |
| 5,821,764 A | * | 10/1998 | Slocum et al. | 324/756.03 |
| 6,037,793 A | * | 3/2000 | Miyazawa et al. | 324/750.03 |
| 6,051,828 A | * | 4/2000 | Patterson | 250/214 R |
| 6,583,614 B2 | * | 6/2003 | Takekoshi | 324/750.19 |
| 6,734,959 B2 | * | 5/2004 | Griffiths et al. | 356/236 |
| 6,842,025 B2 | * | 1/2005 | Gershenzon et al. | 324/750.19 |
| 6,949,941 B2 | * | 9/2005 | Chen | 324/762.02 |
| 7,151,366 B2 | * | 12/2006 | Renken et al. | 324/750.02 |
| 7,219,418 B2 | * | 5/2007 | Byrd | 29/623 |
| 7,239,157 B2 | * | 7/2007 | Stellari et al. | 324/754.23 |
| 7,466,402 B2 | * | 12/2008 | Haskett | 356/213 |
| 7,554,100 B2 | * | 6/2009 | Fudeta | 250/458.1 |
| 7,595,631 B2 | * | 9/2009 | Lu et al. | 324/750.03 |
| 7,851,721 B2 | * | 12/2010 | Sze et al. | 209/573 |
| 8,013,624 B2 | * | 9/2011 | Namiki et al. | 324/762.01 |
| 8,147,100 B2 | * | 4/2012 | Yamaguchi | 362/311.02 |
| 2002/0158653 A1 | * | 10/2002 | Hirt | 324/765 |
| 2003/0048112 A1 | * | 3/2003 | Mori et al. | 324/765 |
| 2003/0151686 A1 | * | 8/2003 | Koyama | 348/304 |
| 2003/0160629 A1 | * | 8/2003 | Chen | 324/765 |
| 2004/0075455 A1 | * | 4/2004 | Mok et al. | 324/754 |
| 2004/0212380 A1 | * | 10/2004 | Koyama et al. | 324/754 |
| 2007/0063721 A1 | * | 3/2007 | Dozier et al. | 324/754 |
| 2007/0096763 A1 | * | 5/2007 | Ehrmann et al. | 324/765 |

(Continued)

*Primary Examiner* — Patrick Assouad
*Assistant Examiner* — Lamarr Brown
(74) *Attorney, Agent, or Firm* — Haynes and Boone, LLP (57) ABSTRACT

The present disclosure provides a semiconductor test system. The semiconductor test system includes a wafer stage to hold a wafer having a plurality of light emitting devices (LEDs); a probe test card operable to test each test field of the wafer; and a light detector integrated with the probe test card to collect light from a LED of the wafer.

20 Claims, 9 Drawing Sheets

U.S. PATENT DOCUMENTS

| | | |
|---|---|---|
| 2007/0170937 A1* | 7/2007 | Endou et al. .................. 324/754 |
| 2008/0136436 A1* | 6/2008 | Hong ............................ 324/760 |
| 2008/0194080 A1* | 8/2008 | Cheng et al. ................. 438/463 |
| 2008/0252317 A1* | 10/2008 | Hopkins et al. ............... 324/755 |
| 2008/0297185 A1* | 12/2008 | Kang et al. ................... 324/754 |
| 2009/0206856 A1* | 8/2009 | Nam et al. .................... 324/754 |
| 2009/0236506 A1* | 9/2009 | Dudgeon et al. ............. 250/228 |
| 2010/0052713 A1* | 3/2010 | Kunimori et al. ............. 324/754 |
| 2010/0085069 A1* | 4/2010 | Smith et al. ................... 324/754 |
| 2010/0085073 A1* | 4/2010 | Lagowski et al. ............. 324/765 |
| 2010/0148813 A1* | 6/2010 | Erickson ....................... 324/758 |
| 2010/0194423 A1* | 8/2010 | Tago et al. .................... 324/765 |
| 2010/0305897 A1* | 12/2010 | Strom ............................ 702/85 |
| 2011/0254574 A1* | 10/2011 | Tashiro ................... 324/750.23 |
| 2011/0279143 A1* | 11/2011 | Toba et al. ............... 324/762.05 |

* cited by examiner

APPARATUS AND METHOD FOR WAFER LEVEL CLASSIFICATION OF LIGHT EMITTING DEVICE

TECHNICAL FIELD

The present disclosure relates generally to an integrated semiconductor test system, and more particularly, to a light emitting device (LED) wafer test system.

BACKGROUND

Semiconductor device fabrication involves many stages of fabrication, including a front end stage of fabrication and a back end stage of fabrication. The front end stage of fabrication may further include various processes such as deposition, lithography and etching/patterning, wafer acceptance testing and chip probe testing. The back end stage of fabrication follows the front end stage and may include other additional processes such as wafer dicing, chip bonding, chip packaging, and final testing.

Of the front end stage of fabrication processes, the chip probe testing is subsequently performed for the electrical performance, which is usually done at a chip level. For a wafer having a plurality of light emitting devices (LEDs), it is usually bonded to other substrate in a three dimensional (3D) packaging. The optical test for LEDs can only be done after the 3D packaging and sawing at the back end stage of fabrication. However, if a LED fails the optical test, the LED chip, along with other components in the 3D package, is discarded, which increases the fabrication cost since other components in the 3D package have to be scraped as well. Therefore, an apparatus and method to effectively test LED devices for both optical and electrical performances at chip level are needed to address the issues identified above.

SUMMARY

The present disclosure provides a semiconductor test system. The semiconductor test system includes a wafer stage to hold a wafer having a plurality of light emitting devices (LEDs); a probe test card operable to test each test field of the wafer; and a light detector integrated with the probe test card to collect light from a LED of the wafer.

The present disclosure also provides another embodiment of a semiconductor test system. The semiconductor test system includes a wafer stage to hold a wafer having a plurality of light emitting devices (LEDs); a probe test card operable to test each test field of the wafer; a light detector integrated with the probe test card and operable to move on a track of the probe test card; and a shield structure configured around the wafer stage to block environmental light from reaching the light detector during test operation.

The present disclosure also provides one embodiment of a method including providing a semiconductor test system for testing a wafer, wherein the semiconductor test system includes a wafer stage to hold a wafer; a probe test card operable to test each test field of the wafer; and a light detector integrated with the probe test card to collect light from the wafer. The method further includes providing a wafer having a plurality of light emitting devices (LEDs) to the wafer stage; and testing a die of a test field on the wafer using the light detector for optical and electrical performance of the die.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 9 is a diagrammatic view of a fabrication system in which the semiconductor test system of FIG. 1 is integrate with.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
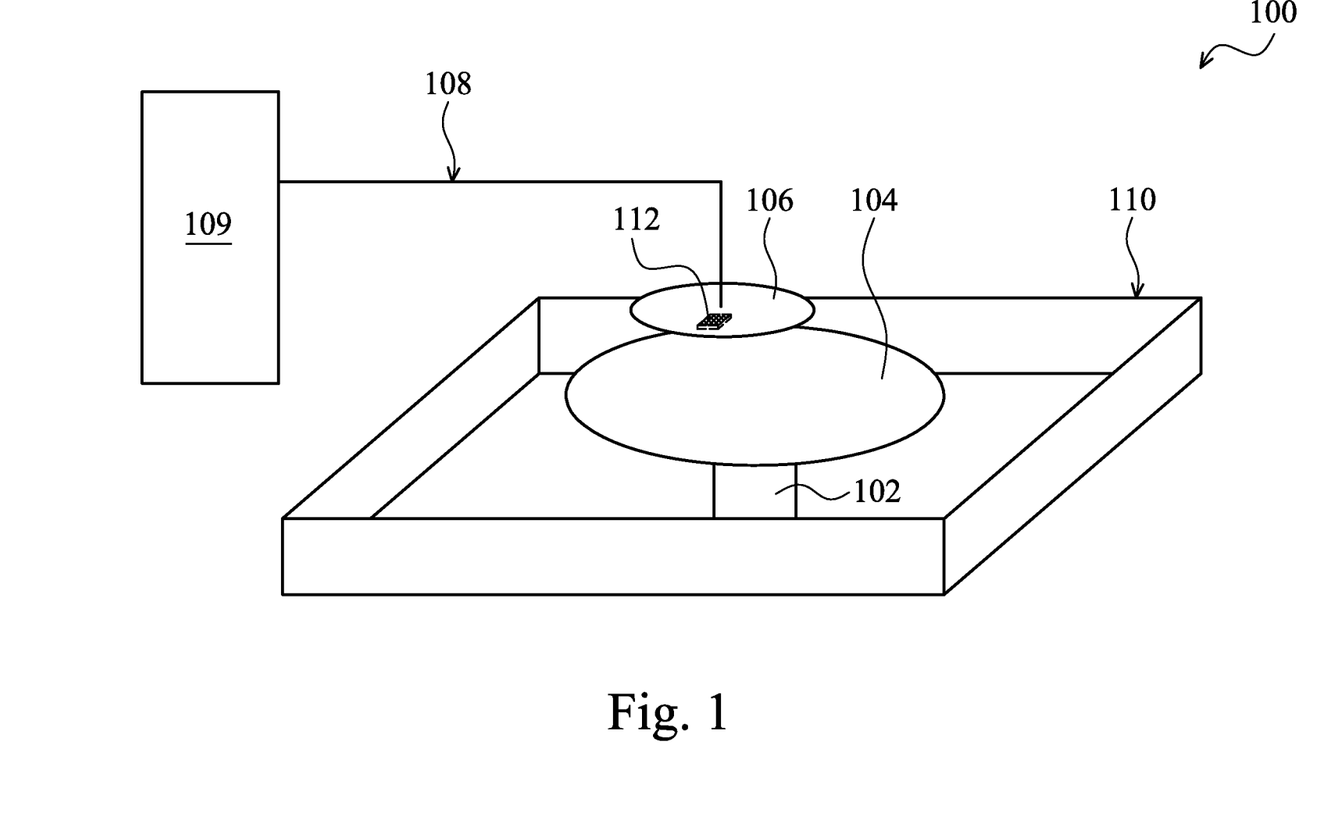
FIG. 1 is a diagrammatic view of a semiconductor testing system according to various aspects of the present disclosure.

Illustrated in FIG. 1 is a diagrammatic view of a semiconductor test system 100. The semiconductor test system 100 is designed to test light emitting devices (LEDs) for both electrical parameters and optical parameters. Particularly, the semiconductor test system 100 is designed to be capable of testing LEDs for the optical parameters of the LEDs, such as the intensity of emitting light, correlated color temperature, forward voltage, stability of the emitting light, the spectrum of the emitting lights or combinations thereof. In the present disclosure, the LEDs include light emitting diodes but are not limited to light emitting diodes.

The semiconductor test system 100 includes a wafer stage 102 configured to hold a semiconductor substrate 104 and operable to orient the semiconductor substrate. In one embodiment, the semiconductor substrate 104 is a semiconductor wafer having a plurality of LEDs The semiconductor test system 100 includes a probe test card (or probe card) 106 designed operable to move relative to the wafer stage 102. The probe card 106 includes a plurality of probe elements that are used to make contact with the semiconductor wafer under test so as to carry out various tests, such as the wafer acceptance testing and/or the chip probe testing. The probe card 106 can be mounted onto a test head 108 and is electrically coupled to a control module 109, which will be described later in more details.

The semiconductor test system 100 includes a shield structure 110 designed to block environmental light from reaching the probe card 106 and the test stage 102 during a test. The shield structure 110 is configured around the wafer stage 102 to effectively block the environmental light from interference with the test. In one embodiment, the shield structure 110 includes an opaque material absorbing the environmental light. In another embodiment, the shield structure 110 have a surface structure designed to absorb the environmental light and/or reflect the environmental light away from the semiconductor test system 100.

Figure 2:
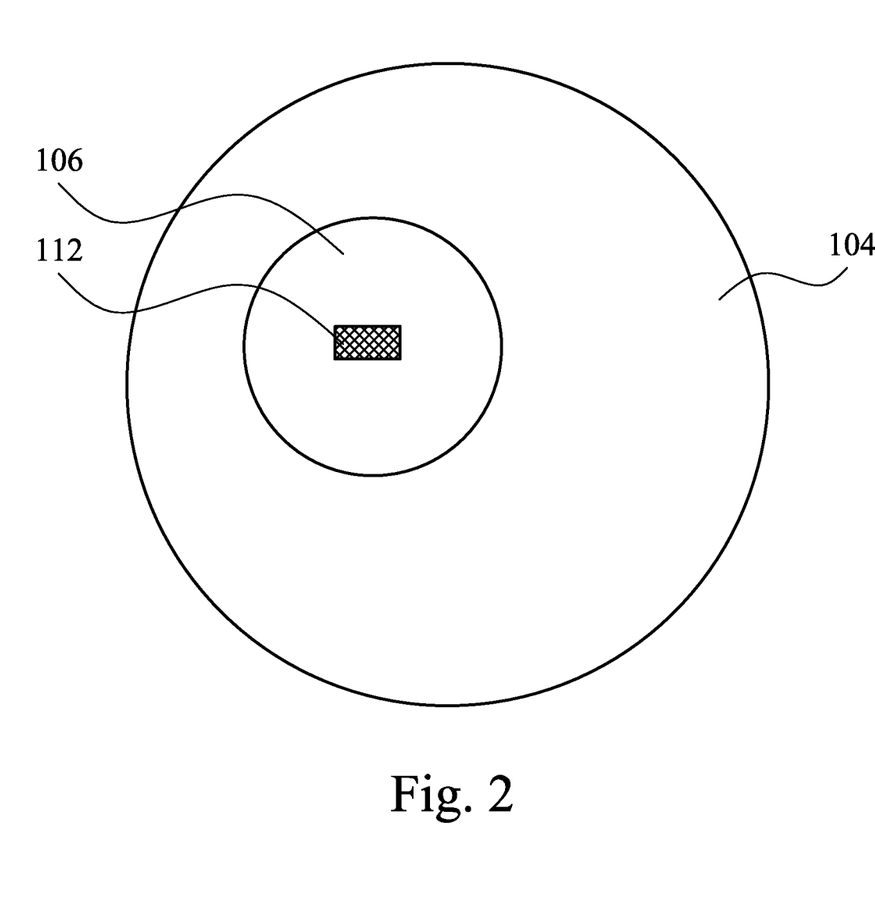
FIG. 2 is a top view of a portion of the semiconductor testing system of FIG. 1.
Figure 3:
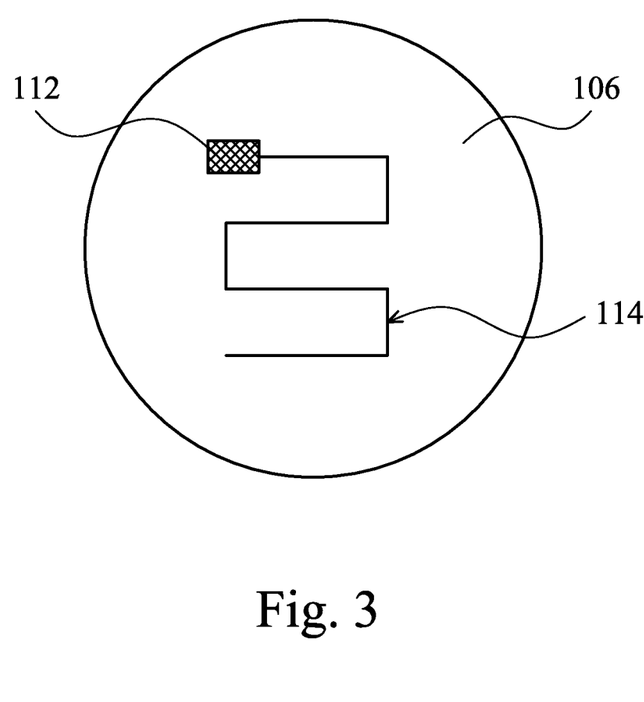
FIG. 3 is a diagrammatic view of a probe card that is a part of the semiconductor testing system of FIG. 1.

The semiconductor test system 100 includes a light detector 112 integrated with the probe card and is configured to effectively collect light from a LED of the semiconductor wafer during a test. FIG. 2 is a top view of a portion of the semiconductor testing system of FIG. 1. FIG. 3 is a diagrammatic view of a probe card that is a part of the semiconductor testing system of FIG. 1. With additional reference to FIGS. 2 and 3, the semiconductor test system 100 is further described. In one embodiment, the light detector 112 is integrated with the probe card such that the light detector 112 is secured in the center of the probe card such that it can effectively test every die in a test field of the semiconductor wafer 104.

In another embodiment, the light detector 112 is designed and configured operable to move relative to the probe card 106 such that the light detector can be positioned near a die of the semiconductor wafer during a test. In one embodiment, the semiconductor test system 100 further includes a track 114 formed on the probe card 106, as illustrated in FIG. 3. The track 114 is designed in a pattern such that the light detector 112 can reach close to any die in a field within a predefined distance. In one example, the track 114 has a "S" shaped pattern or the likes as illustrated in FIG. 3. The semiconductor test system 100 further includes a mechanism to control the light detector to move along the track 114. In one example, the mechanism is capable of moving the light detector 112 along the track in a step-wise mode.

In another embodiment, the semiconductor test system 100 includes a plurality of light detectors secured on the probe card 106, configured as an array and designed to test multiple dies sequentially in a test field without moving the light detectors. Alternatively, the plurality of light detectors are designed operable to test the multiple dies in a parallel mode for efficiency with a proper light isolation to eliminate light interference among the multiple dies. For example, each of the light detectors is configured with a proper shield feature such that only the light from a LED of the corresponding die can reach the light detector.

Figure 4:
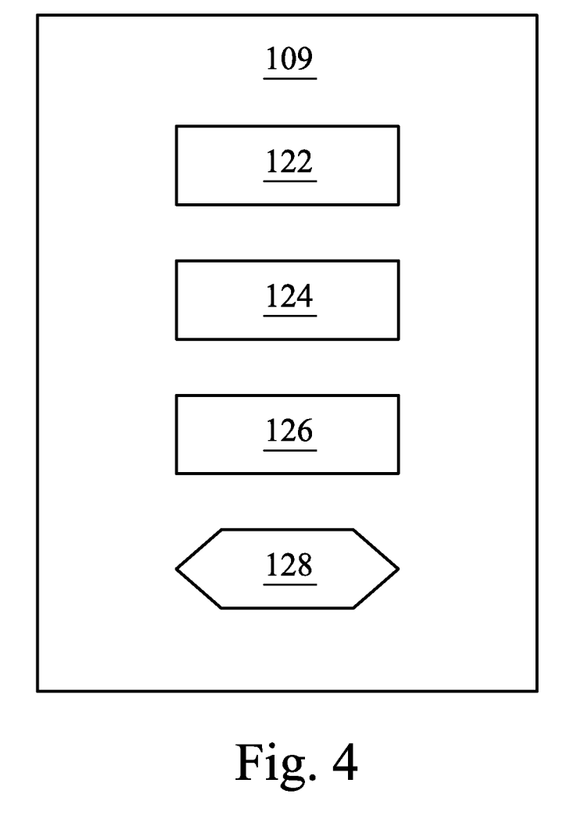
FIG. 4 is a diagrammatic view of a control module of the semiconductor testing system of FIG. 1.

Referring to FIG. 4 as a diagrammatic view of the control module 109 of the semiconductor testing system of FIG. 1. The control module 109 includes tools including circuits that control the operation of the test head 108. For example, the control module 109 may include microcontrollers implemented with software codes that are programmed to operate the test head 108 and light detector 112. Particularly, the control module 109 includes a probe sub-module 122 designed to control the probe test card for its test operation. In one embodiment, the probe sub-module 122 is designed to control the probe test card 106 through controlling the test head 108. In another embodiment, the probe sub-module 122 is capable of controlling the probe test card 106 for transitional motion relative to the wafer stage 102 such that the probe test card can be positioned over any test field of the semiconductor wafer 104 on the wafer stage 102. In another embodiment, the probe sub-module 122 is capable of controlling the probe test card 106 for motion along the vertical direction to adjust its distance to the semiconductor wafer 104 on the wafer stage 102.

The control module 109 includes a light detector sub-module 124 designed to control the light detector (or light detectors) 112 for its test operation. The light detector sub-module 124 may be designed to control the light detector 112 through controlling the test head 108. In one embodiment, the light detector sub-module 124 is designed capable of controlling the light detector 112 to move along the track 114 integrated with the probe test card 106. In one example, the light detector sub-module 124 is capable of controlling the light detector 112 to move in a step-wise mode through a step motor or other mechanism.

The control module 109 may further include a wafer stage sub-module 126 designed to control the wafer stage 102 for its test operation. In one embodiment, the wafer stage sub-module 126 is capable of controlling the wafer stage 102 to orient the semiconductor wafer secured on the wafer stage. In another embodiment, the wafer stage sub-module 126 may be capable of controlling the wafer stage 102 to adjust its position on the vertical direction.

The control module 109 further includes an optical sub-module 128 designed to process light data collected from the light detector 112 (or light detectors), such as light intensity of a LED. In one embodiment, the optical sub-module 128 includes a formula to normalize the light intensity according to an angle of the light and a distance from the LED to the light detector. The optical sub-module 128 may be capable to process the light data for other optical parameters, such as the spectrum of the light, correlated color temperature, luminous flux and stability of the light (or change of the light intensity over time).

The control module 109 may further include a switch sub-module (not shown) designed to switch the electrical signal from a first die to a second die such that a LED of the second die can be tested for its optical and electrical parameters including forward voltage. The tested LEDs are classified into different bins (or grades) according to tested optical and electrical parameters. The tested optical and electrical results are also stored in semiconductor test system 100. LEDs in different bins can be used for different applications and may utilize different packages. In one example, LEDs are grouped into three groups (also referred to as bins) according to the tested electric and optical data. In furtherance of this example, LEDs in bin 1 are used for automotive application, LEDs in bin 2 are used for backlight and LEDS in bin 3 are used for streetlight application. LEDs in different bins may use different packages or may be distributed customers. In another example, LEDs in bin 1 use ceramic package, LEDs in bin 2 use plastic package, and LEDs in bin 3 use for plastic package plus heat sink.

The test head 108 includes various electronic components that are used to measure characteristics of a device under test (DUT), such as a semiconductor wafer having a plurality of LEDs. For example, the test head 108 is capable of measuring both electrical and optical characteristics of the DUT, such as current, voltage, resistance and light intensity. The test head 108 further includes various circuit components such as operational amplifiers (op-amps), current mirrors, analog-to-digital converters (ADC), and digital-to-analog converters (DAC). The test head 108 is used to measure the parameters of the above-referenced semiconductor wafer, such as $I_{on}$ (turn on current), $I_{off}$ (turn off current), $I_{leak}$ (leakage current), $V_t$ (threshold voltage), and L (light intensity).

Figure 5:
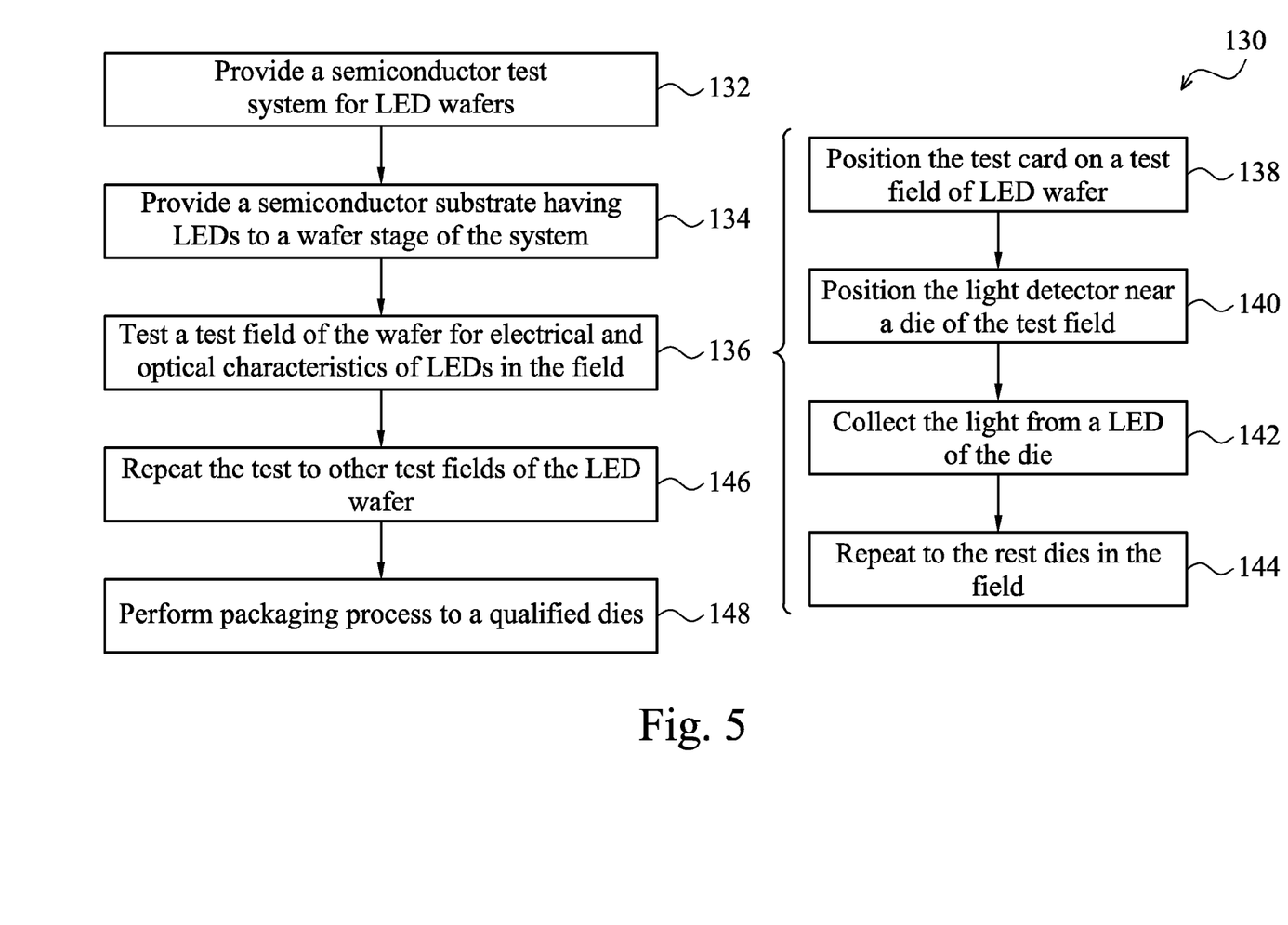
FIG. 5 is a flowchart of a method to test a LED wafer using the semiconductor testing system of FIG. 1.
Figure 6:
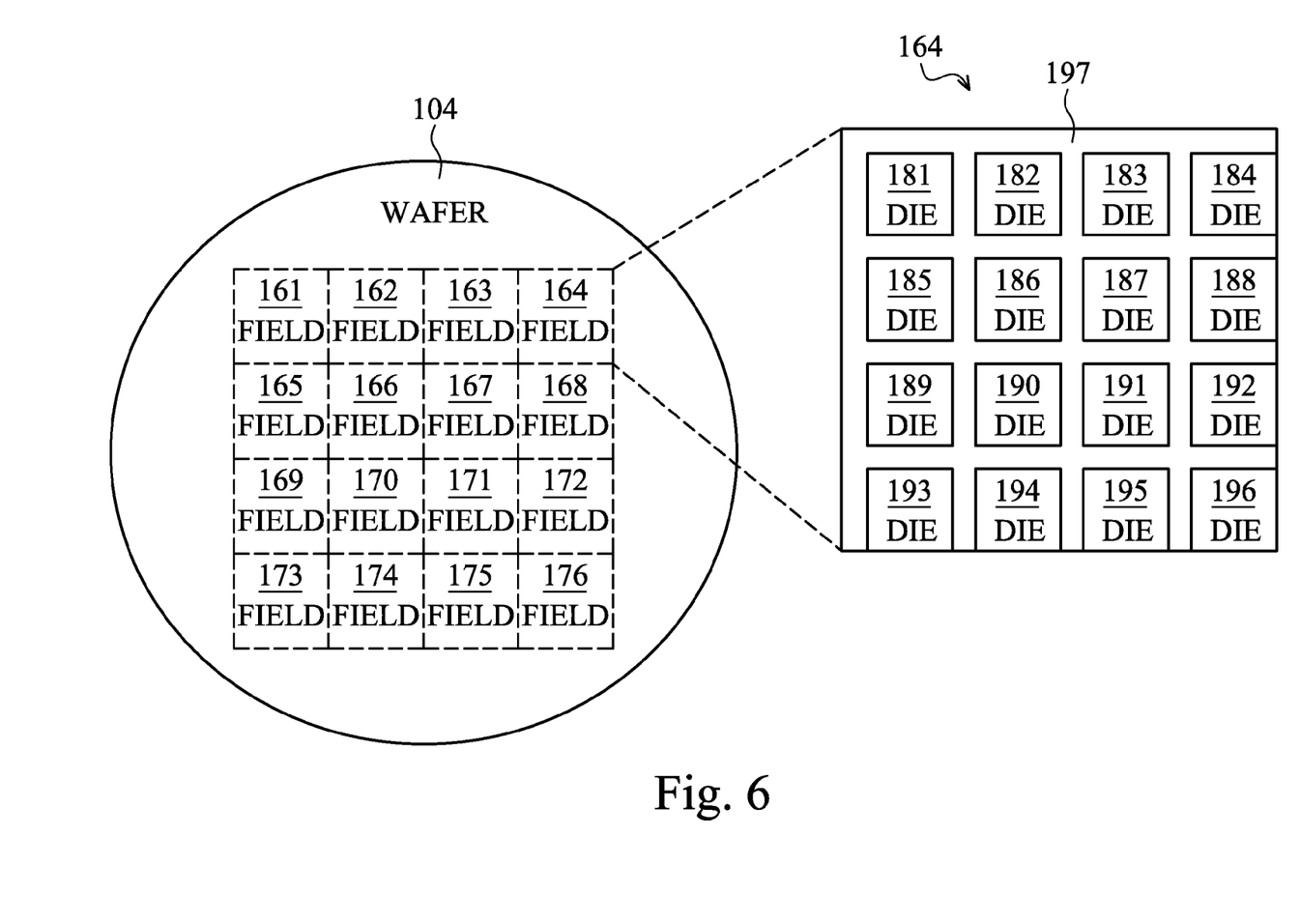
FIG. 6 is a diagrammatic view of a LED wafer that can be tested using the semiconductor testing system of FIG. 1.
Figure 7:
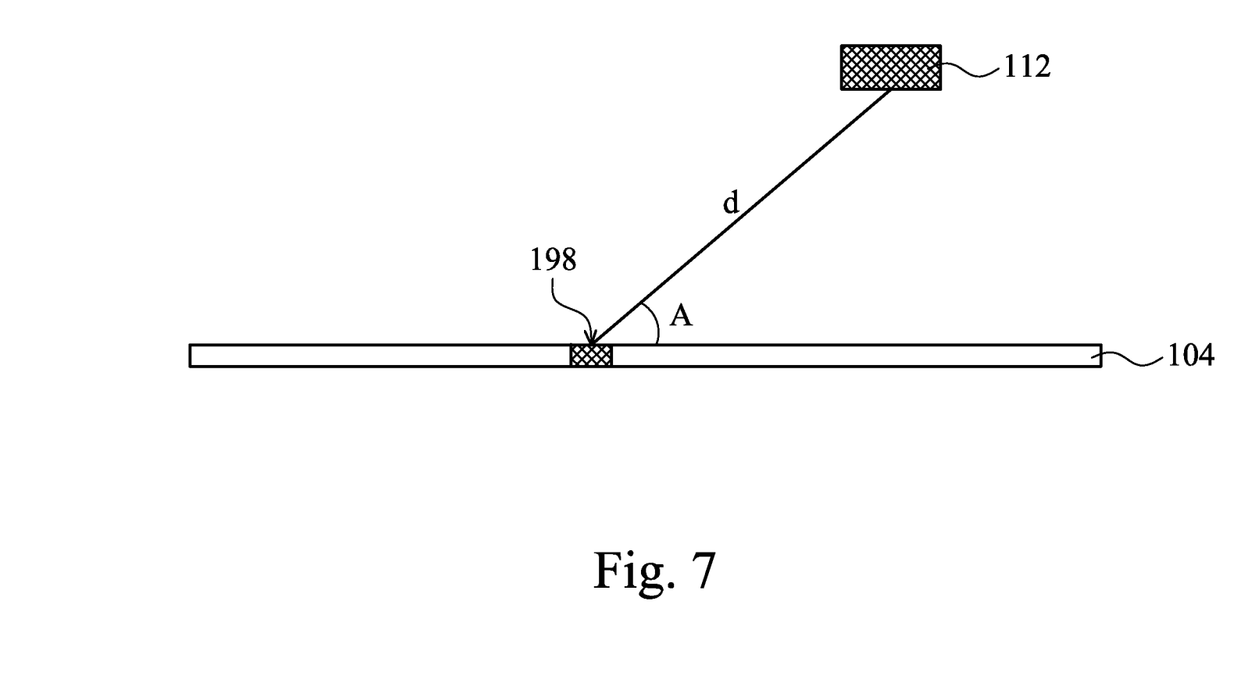
FIG. 7 is a diagrammatic view of a setup of the semiconductor testing system of FIG. 1.
Figure 8:
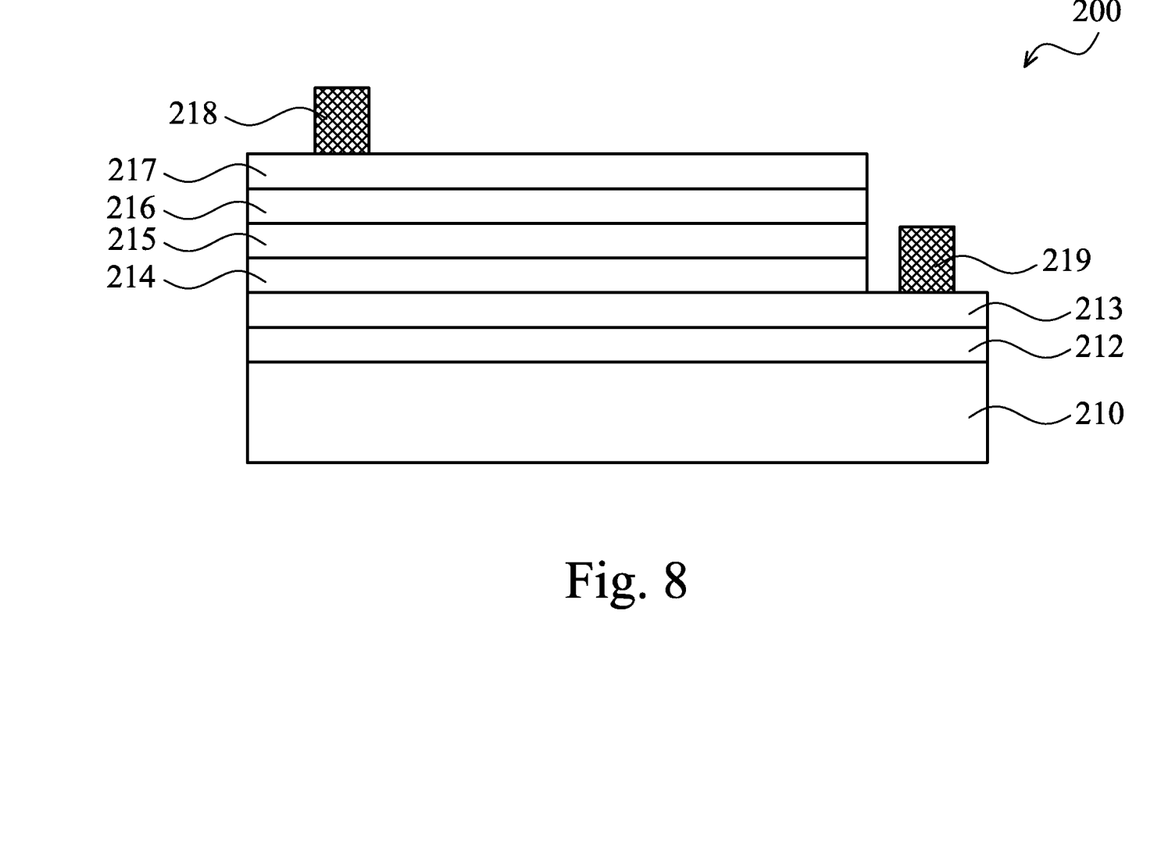
FIG. 8 is a sectional view of a light emitting device to be tested in one embodiment.

Referring to FIG. 5 and additionally referring to FIGS. 6 through 8, a method 130 for testing a semiconductor wafer having a plurality of LEDs is described. The method 130 begins at step 132 by providing a semiconductor test system, such as The semiconductor test system 100 of FIG. 1, for testing a semiconductor wafer having a plurality of LEDs. The semiconductor test system is capable of testing a LED wafer for its optical and electrical parameters.

Referring to FIGS. 5 and 6, the method 130 proceeds to step 134 by providing a semiconductor wafer having a plurality of LEDs (also referred to as a LED wafer) to the wafer stage 102 of the semiconductor test system 100. An embodiment of a LED wafer 104 having a plurality of LEDs is illustrated in FIG. 6 in a diagrammatic view. The LED wafer 104 may additionally include other functional devices, such as field-effect transistors (FETs) and/or other active/passive devices. The wafer 104 includes a plurality of test fields (or fields), for example fields 161-176 defined on the wafer 104. Each of the fields 161-176 includes a plurality of semiconductor dies and test keys (also referred to as test lines). For purposes of illustration, the field 164 is enlarged to show more detail. The field 164 includes dies 181-196. Each of the dies 181-196 may include a plurality of LEDs and other circuit components that are not illustrated herein. The dies 181-196 also each includes a plurality of test pads (not illustrated) that can make electrical contact with the probe card. The wafer probe testing parameters are gathered through testing the dies 181-196. The optical parameters, such as the light intensity, can be gathered from the light detector 112 of the semiconductor test system 100.

The dies 181-196 are separated on the wafer 130 by a plurality of scribe lines that form a scribe line region 197. The scribe line region 197 is a region of the wafer 100 that will be sawed in a later process, so that the dies 181-196 will be separated and packaged as IC dies. In one example, a plurality of test keys are implemented in the scribe line region 197. The test keys each include a plurality of test pads that can make electrical contact with the probe card 106 (FIG. 1). The performance of different dies of the wafer 130 are tested by measuring the properties of different test keys and/or LEDs in the dies. Hence, the electrical parameters of the wafer are gathered through testing the test keys and/or LEDs in the dies while the optical parameter(s) are gathered through the light detector 112 of the semiconductor test system 100. A light emitting device 200 formed on the LED wafer is illustrated in FIG. 8 as an example. The light emitting device is a semiconductor p-n junction that can emit spontaneous radiation in ultraviolet, visual or infrared regions of the electromagnetic spectrum, therefore is referred to as a light emitting diode. The LED 200 is formed on a substrate 210 such as a sapphire, silicon carbide, gallium nitride (GaN) or silicon substrate. In one embodiment, the LED includes a n-type impurity doped cladding layer 213 and a p-type doped cladding layer 215 formed on the n-GaN 213. In one embodiment, the n-type cladding layer 213 includes n-type gallium nitride (n-GaN) and the p-type cladding layer 215 includes p-type gallium nitride (p-GaN). Alternatively, the cladding layers may include GaAsP, GaPN, AlInGaAs, GaAsPN or AlGaAs doped with respective types. The LED 200 may further include an indium gallium nitride/gallium nitride (InGaN/GaN) multi-quantum well layer 214 disposed between the n-GaN 213 and p-GaN 215. The LED 200 may further include a buffer layer 212, such as a GaN buffer layer, formed between the sapphire substrate 210 and the n-GaN 213. The LED 200 may further include an InGaN/GaN layer 216 formed on the p-GaN 216. A transparent conductive layer 217, such as indium tin oxide (ITO), is formed on the p-GaN 215 (as illustrated in FIG. 8), for coupled to a p-electrode 218. A n-electrode 219 is formed to contact the n-GaN layer 213.

The light emitting diode is provided for only illustration and may have different variations in various applications. Further, the light emitting devices are not limited to light emitting diodes. Other types of light emitting devices may be additionally or alternatively formed on the LED wafer.

Referring to FIG. 5, the method 130 proceeds to step 136 by testing a test field of the LED wafer 104 for both electrical and optical characteristics, such as the electrical parameters for FETs and optical parameters of the LEDs in the test field. The step 136 may further include various sub-steps. In one embodiment, the step 136 includes a sub-step 138 for positioning the probe test card 106 to a test field of the LED wafer 104. For example, the probe card 106 is positioned such that it is aligned with the test field so the probe card can properly contacts to the test pads. In another embodiment, the step 136 may further include a sub-step 140 for positioning the light detector 112 near a die in the test field or aligned with the die. For example, the light detector 112 is moved along the track 114 of the probe card 106 such that the distance between the light detector 112 and the die is minimized or within a predefined distance or an effective distance.

The step 136 includes a sub-step 142 for collecting light from a LED of the die. In this case, the collected light intensity of the LED is not only a function of the emitted light of the LED but also a function of the configuration between the LED and the light detector 112. So the method 130 also provides a mechanism to normalize the light intensity according to an angle of the collected light and a distance from the LED and the light detector. In one embodiment, the light intensity of the collected light is normalized by a formula as $$In = K \times Cosine(A) \times Ic/d^2$$

In the above formula, the parameter "In" is the normalized light intensity, "Ic" is the collected light intensity and "K" is a constant related to the semiconductor test system and the environment, and can be determined by experiment. Other parameters of the above formula are defined and explained with reference to FIG. 7. FIG. 7 is a diagrammatic view of a setup of the semiconductor testing system 100, in which a configuration between the light detector 112 and the die 198 is illustrated. The parameter "A" is the angle of the light from the die 198 to the light detector 112. The parameter "d" is the distance between the die 198 to the light detector. In a particular case, the parameter "A" is the angle of the light from a LED of the die 198 to the light detector 112. The parameter "d" is the distance between the LED of the die 198 to the light detector 112. The collected light intensity "Ic" is converted to the normalized light intensity "In" according to the above formula. The normalized light intensity "In" represents only the optical characteristics of the corresponding LED and is not relevant to the configuration between the LED and the light detector during the test.

The step 136 may further include a sub-step 144 for repeating the test actions to other dies in the same test field of the LED wafer 104 in a similar way. In one embodiment, the light detector 112 is repositioned to be aligned with or near the die to be tested. In another embodiment, the sub-step 144 may further include repeating the test actions to other LEDs in the same die in a similar way. In other embodiments, a die may include only one LED or only one LED of the die is tested for optical performance. Alternatively, for each die, one or more LEDs in the test key are tested for optical performance of the corresponding die.

Referring back to FIG. 5, the method 100 proceeds to step 146 by repeating the optical test and electrical test to other test fields of the LED wafer 104 until all of the test fields of the LED wafer 104 are exhausted. When each test field of the LED wafer 104 is tested, a procedure similar to step 136 is applied to the corresponding test field. For example, the substeps 138 through 144 are performed to optically and electrically test the dies in each test field. After all dies in the LED wafer 104 have been tested, a first subset of dies pass both electrical and optical acceptance tests, marked as and referred to as good dies (or qualified dies). A second subset of dies fail either one or both of the electrical and optical acceptance tests, marked as and referred to as bad dies (or disqualified dies). The above process is referred to as a classification of LED devices on the wafer level. The classification of LED devices further include classifying the qualified dies into different bins according to tested optical and electrical parameters of the respective LEDs. LEDs in different bins can be used for different applications and may utilize different packages. The existing method can only perform the classification on the die level, which is after the wafer has been bonded to other substrates, packaged in 3D and even sawed into separate dies. When a bad die is discarded after failure of the acceptance test in the existing method, the bonded components have to be scraped along with the bad LED die, increasing the manufacturing cost.

The method 100 proceeds to step 148 by performing packaging and other processes to the qualified dies. In one embodiment, the LED wafer is first sawed into individual dies. The disqualified dies are discarded. The qualified dies are bonded to other substrates. In one example, the qualified dies are bonded to other circuits in 3D technologies, such as through silicon via (TSV) technique. Other packaging procedure may be followed to form LED dies for use according to respective applications. By the wafer level LED test system disclosed herein, such as the semiconductor test system 100, and the method 100 to utilize the wafer level LED test system, early classification of the LEDs at wafer level can be achieved. Both optical and electrical parameters are gathered at wafer level before the wafer sawing and packaging. Any bad LED dies can be identified at wafer level for early discriminative process. After the sawing, the identified bad dies are discarded. Only good dies are packaged, such as bonded in 3D technologies, reducing packaging cost and increasing fabrication efficiency. Further, both optical and electrical parameters are gathered at wafer level in one integrated apparatus, reducing the test cost and increasing the test efficiency.

The tested and classified LEDs are bonded in different package types or applications according to the optical and electrical parameters. Particularly, the tested LEDs are classified into different bins according to tested optical and electrical parameters. LEDs in different bins can be used for different applications and may utilize different packages. For example, LEDs are grouped into three bins according to the tested electric and optical data. LEDs in bin 1 are used for automotive, LEDs in bin 2 are used for backlight and LEDS in bin 3 are used for streetlight application. In furtherance of the example, LEDs in bin 1 are integrated with and configured in automotive unit or module. LEDs in bin 2 are integrated with and configured in backlight unit or module. LEDS in bin 3 are integrated with and configured in streetlight unit or module. In another example, LEDs in bin 1 use ceramic package, LEDs in bin 2 use plastic package, and LEDs in bin 3 use for plastic package plus heat sink.

The above method and system may be extended and modified and may include proper variations, embodiments, and alternatives without departure of the spirit of the invention. For example, the semiconductor test system 100 may be used for testing other light emitting devices at wafer level for both optical and electrical parameters. In another example, the LED wafer may additionally include other types of active and passive devices for proper applications. In another example, a LED wafer is tested by the semiconductor test system 100 only for the optical performance of the LEDs.

The current embodiment of the semiconductor test system 100 provides a suitable configuration for integrating the electrical acceptance testing and optical acceptance test into a combined single stage of testing. Previously, separate testers were needed to carry out the wafer acceptance testing and optical test at die level. By integrating the electrical wafer acceptance testing and the optical test, the current embodiment offers several advantages, it being understood that different embodiments may offer different advantages, and that no advantage is required for all the embodiments. One advantage is reduced processing time, since the two tests are performed at wafer level concurrently or simultaneously. Another advantage is reduced costs, since the test systems for both tests are reduced into one LED wafer test system, the test time is reduced, and only disqualified LED dies are discarded without wasting other good components.

Figure 9:
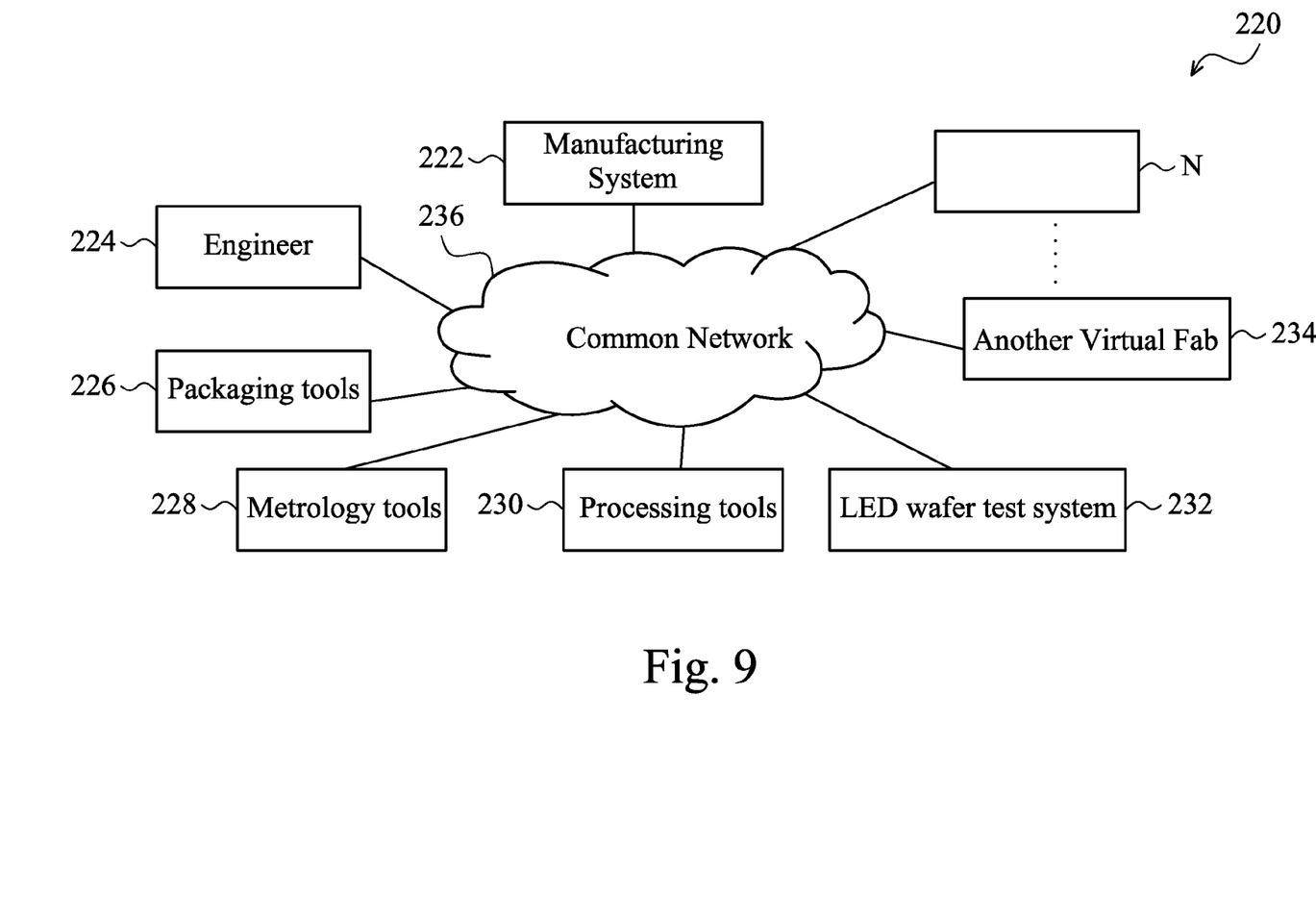

FIG. 9 illustrates a virtual integrated circuit fabrication system (a "virtual fab") 220, to which the semiconductor test system 100 of FIG. 1 may be connected and the method 130 may be implemented with. The virtual fab 220 includes a plurality of entities 222, 224, 226, 228, 230, 232, 234 . . . , N that are connected by a communications network 236. The network 236 may be a single network or may be a variety of different networks, such as an intranet and the Internet, and may include both wireline and wireless communication channels.

In the present example, the entity 222 represents a manufacturing system for semiconductor manufacturing collaboration and provision, the entity 224 represents an engineer, the entity 226 represents packaging tools, the entity 228 represents metrology tools for IC testing and measurement, the entity 230 represents processing (fabrication) tools, the entity 232 represents a LED wafer test system, such as the semiconductor test system 100 of FIG. 1, capable of testing LEDs at wafer level for both optical and electrical parameters to determine if each die of a LED wafer is acceptable for the intended application, and the entity 234 represents another virtual fab (e.g., a virtual fab belonging to a subsidiary or a business partner). Each entity may interact with other entities and may provide manufacturing services to and/or receive services from the other entities.

It is understood that the entities may be concentrated at a single location or may be distributed, and that some entities may be incorporated into other entities. In addition, each entity may be associated with system identification information that allows access to information within the system to be controlled based upon authority levels associated with each entities identification information. The virtual fab 220 enables interaction among the entities for the purpose of IC manufacturing, as well as the provision of services. In the present example, IC manufacturing includes receiving an integrated circuit design having LEDs, fabrication, testing including LED wafer level test for both optical and electrical parameters, and packaging, such 3D packaging. One of the function provided by the virtual fab 220 may enable collaboration and information access in such areas as fabrication, testing and packaging. It is understood that these areas are exemplary, and that more or less information may be made available via the virtual fab 220 as desired.

Another service provided by the virtual fab 220 may integrate systems between facilities, such as between the LED wafer test system 232 and the processing tools 230 (and/or the packaging tools 226). Such integration enables facilities to coordinate their activities. For example, integrating the LED wafer test system 232 and the processing tools 230 may enable manufacturing information to be incorporated more efficiently into the fabrication process, and may enable optical data from the LED wafer test system to the processing tools (and/or packaging tools) for improvement and incorporation. The above described method and system only serve as examples.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor test system, comprising:
   a wafer stage to hold a wafer having a plurality of light emitting devices (LEDs);
   a probe test card operable to test each test field of the wafer; and
   a light detector secured on the probe test card to collect light from a LED of the wafer and operable to move with the probe test card with respect to the wafer stage.

2. The semiconductor test system of claim 1, further comprising a shield structure designed and configured to block environmental light from reaching the light detector.

3. The semiconductor test system of claim 1, wherein the shield structure is configured around the wafer stage to shield the light detector and the wafer from the environmental light.

4. The semiconductor test system of claim 1, wherein the light detector is integrated with the probe test card and is configured to move relative to the probe test card.

5. The semiconductor test system of claim 4, wherein the probe test card further includes a track configured such that the light detector is operable to move along the track.

6. The semiconductor test system of claim 5, wherein the track is designed to a pattern such that the light detector is operable to move close to any location of the probe test card within a predefined distance.

7. The semiconductor test system of claim 5, wherein the track is designed such that the light detector is operable to move to a location for test any die in a test field of the wafer.

8. The semiconductor test system of claim 1, wherein the probe test card is operable to move to any test field of the wafer on the wafer stage.

9. The semiconductor test system of claim 1, further comprising a control module including:
   a probe sub-module designed to control the probe test card in a test operation; and
   a light detector sub-module designed to control the light detector in the test operation.

10. The semiconductor test system of claim 1, further comprising a plurality of light detectors configured on the probe test card in an array and capable of parallel testing a plurality of dies in a test field of the wafer.

11. A method, comprising:
    providing a semiconductor test system for testing a wafer, wherein the semiconductor test system includes:
      a wafer stage to hold a wafer;
      a probe test card operable to test each test field of the wafer; and
      a light detector integrated with the probe test card to collect light from the wafer;
    providing a wafer having a plurality of light emitting devices (LEDs) to the wafer stage;
    testing a die of a test field on the wafer using the light detector for optical and electrical performance of the die; and
    classifying the die into a bin according to the optical and electrical performance of the die.

12. The method of claim 11, further comprising:
    repeating the testing to a next die of the test field by moving the light detector near a next die; and
    repeating the test to other test fields of the wafer.

13. The method of claim 11, wherein the testing a die of a test field includes:
    positioning the probe card to the test field of the wafer; and
    positioning the light detector near the die.

14. The method of claim 11, wherein the testing a die further includes:
    collecting light from a light emitting device (LED) of the die; and
    normalizing light intensity by a formula as $I=K \times \text{Cosine}(A) \times I_c/d^2$, wherein $I_c$ is the light collected from the LED, A is an angle of the light and d is a distance from the LED to the light detector.

15. The method of claim 11, further comprising: sawing the die from the wafer; and packaging the die if the die passes the testing.

16. The method of claim 11, further comprising:
    testing a plurality of dies of the wafer using the light detector for optical and electrical parameters;
    classifying the plurality of dies into different bins according to respective values of the optical and electrical parameters; and
    packaging each of the plurality of dies according to respective bin.

17. The method of claim 16, wherein the packaging each of plurality of dies includes using a package technology selected from the group consisting of ceramic package, plastic package, and plastic package plus heat sink.

18. A semiconductor test system, comprising:
    a wafer stage to hold a wafer having a plurality of light emitting devices (LEDs);
    a probe test card operable to test each test field of the wafer; and
    a light detector integrated with the probe test card to collect light from a LED of the wafer, wherein the light detector is integrated with the probe test card and is configured to move relative to the probe test card.

19. The semiconductor test system of claim 18, wherein the light detector is operable to move with the probe test card with respect to the wafer stage.

20. The semiconductor test system of claim 18, further comprising a shield structure designed and configured to block environmental light from reaching the light detector.

* * * * *